United States Patent
Doty

Patent Number: 5,289,130
Date of Patent: Feb. 22, 1994

[54] NMR SAMPLE ROTOR COOLING TECHNIQUE

[75] Inventor: F. David Doty, Columbia, S.C.

[73] Assignee: Doty Scientific Inc., Columbia, S.C.

[21] Appl. No.: 923,324

[22] Filed: Jul. 31, 1992

[51] Int. Cl.⁵ .............................................. G01V 3/00
[52] U.S. Cl. ..................................... 324/321; 324/307
[58] Field of Search .............. 324/300, 307, 318, 322; 128/653.5

[56] References Cited

U.S. PATENT DOCUMENTS

| | | | |
|---|---|---|---|
| 4,254,373 | 3/1981 | Lippmaa et al. | 324/321 |
| 4,275,350 | 6/1981 | Hill et al. | 324/321 |
| 4,456,882 | 6/1984 | Doty | 324/321 |
| 4,511,841 | 4/1985 | Bartuska et al. | 324/321 |
| 4,739,270 | 4/1988 | Daugaard et al. | 324/321 |
| 4,899,111 | 2/1990 | Pines et al. | 324/321 |
| 4,940,942 | 4/1989 | Bartuska et al. | 324/321 |
| 5,202,633 | 4/1993 | Doty et al. | 324/321 |

*Primary Examiner*—Michael J. Tokar
*Attorney, Agent, or Firm*—Oppedahl & Larson

[57] ABSTRACT

The frictional heating of an NMR sample spinner supported on a cylindrical gas bearing inside a cylindrical bearing stator is negated by recirculating the turbine exhaust gas over the rotor surface inside the RF coil. The technique is more effective with microturbines of relatively high insentropic efficiency. Plugs extend axially into the sample container from each end so that the sample is confined to the central region beyond the gas bearing region so the thermal gradients are minimized and RF homogeneity is improved.

16 Claims, 2 Drawing Sheets

NMR SAMPLE ROTOR COOLING TECHNIQUE

FIELD OF THE INVENTION

The field of this invention is high speed spinners for nuclear magnetic resonance employing gas bearings and microturbines.

BACKGROUND OF THE INVENTION

In U.S. Pat. No. 4,456,882 I disclose a technique for NMR Sample Spinning using cylindrical, ceramic sample containers with press-fit plastic turbines on hydrostatic air bearings. A co-pending application, Ser. No. 07/607,521, discloses novel radial inflow microturbines and other improvements appropriate for high temperature applications. Another co-pending application, Ser. No. PCT/US91/01225 discloses an NMR Sample spinner capable to achieving supersonic surface speeds. Other NMR MAS spinners are disclosed in U.S. Pat. Nos. 4,254,373, 4,275,350, 4,511,841, 4,899,111 and the references cited therein.

It is well known that considerable sample heating, sometimes in excess of 90° C., results from frictional heating of the bearing gas in high-speed NMR sample spinners.

Cooling by insentropic expansion in turbines is well known and widely used in Brayton cycle refrigeration systems.

SUMMARY OF THE INVENTION

The insentropically cooled exhaust gas from the drive turbine in an NMR sample spinner is circulated over the sample region to cancel the effects of frictional heating at high rates of rotation.

DETAILED DESCRIPTION OF THE PREFERRED EMBODIMENT

Figure 1:
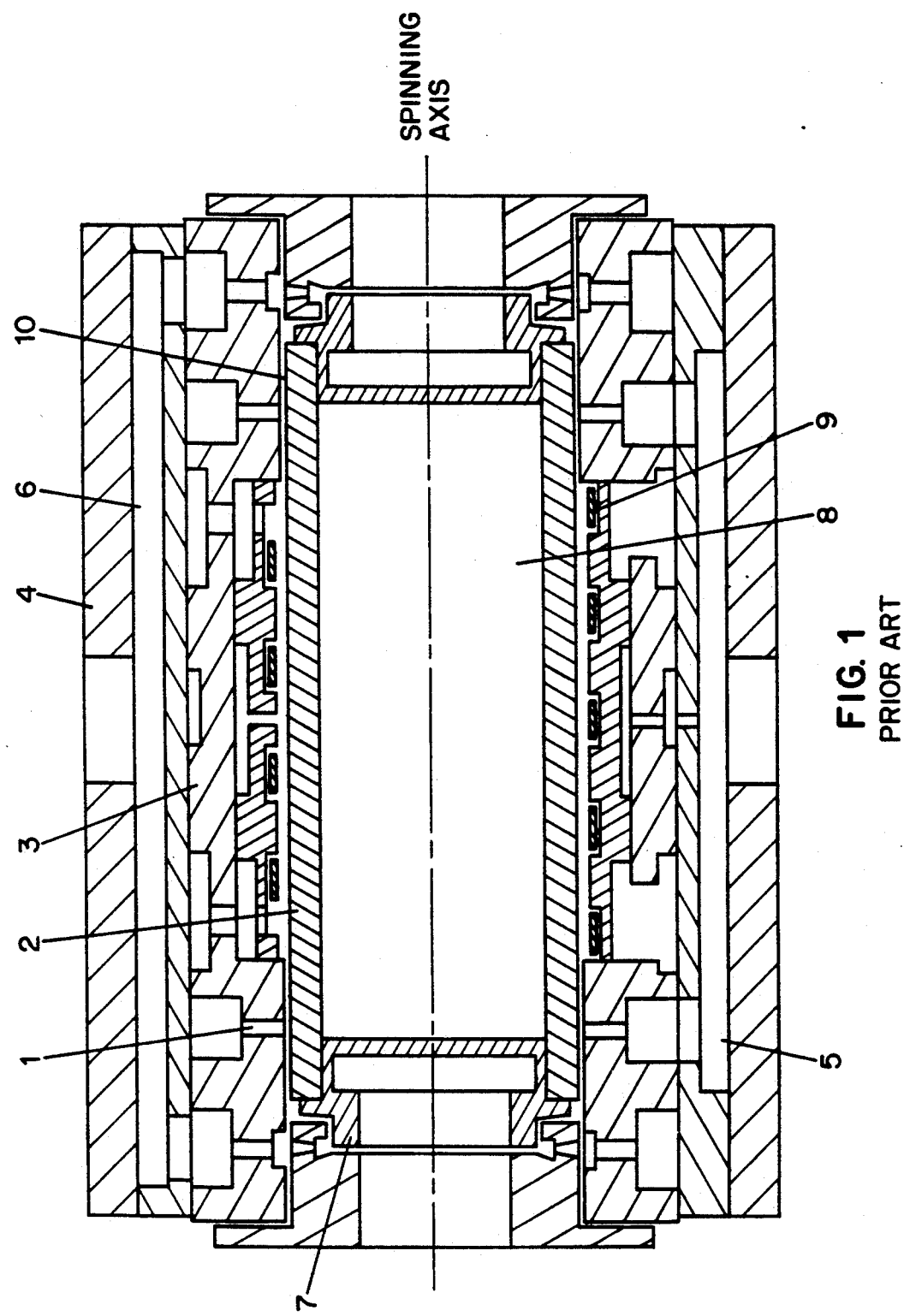
FIG. 1 illustrates a prior art high speed NMR sample spinner.

The prior art high-speed NMR sample spinner shown in FIG. 1 has hydrostatic air bearing orifices 1 introducing pressurized gas radially to support the ceramic journal or rotor 2 inside a bearing stator 3. The bearing stator 3 is supported inside a housing 4. A bearing manifold 5 provides distribution of air to the bearing orifices. A drive manifold 6 provides distribution of air to the drive turbines 7 to cause high speed rotation of the NMR sample 8. An RF coil 9 excites and detects NMR precession signals form the spinning sample 8. The spinner system is substantially cylindrically symmetric about the spinning axis, and it is often symmetric for a reflection through a plane perpendicular to the spinning axis.

The drive power supplied by the turbines 7 is approximately equal to the frictional power in the gas journal bearing regions 10 where the clearance is quite small. Other frictional losses are relatively small. Hence the power extracted from the gas expanding through the turbines is approximately equal to the frictional heating in the journal bearings. However the flow rate through the turbines is considerably larger than that through the bearings. Hence, the temperature rise in the bearings is considerably greater than the temperature drop in the turbines. Joule-Thompson cooling in the bearing orifices is negligible under most conditions.

Figure 2:
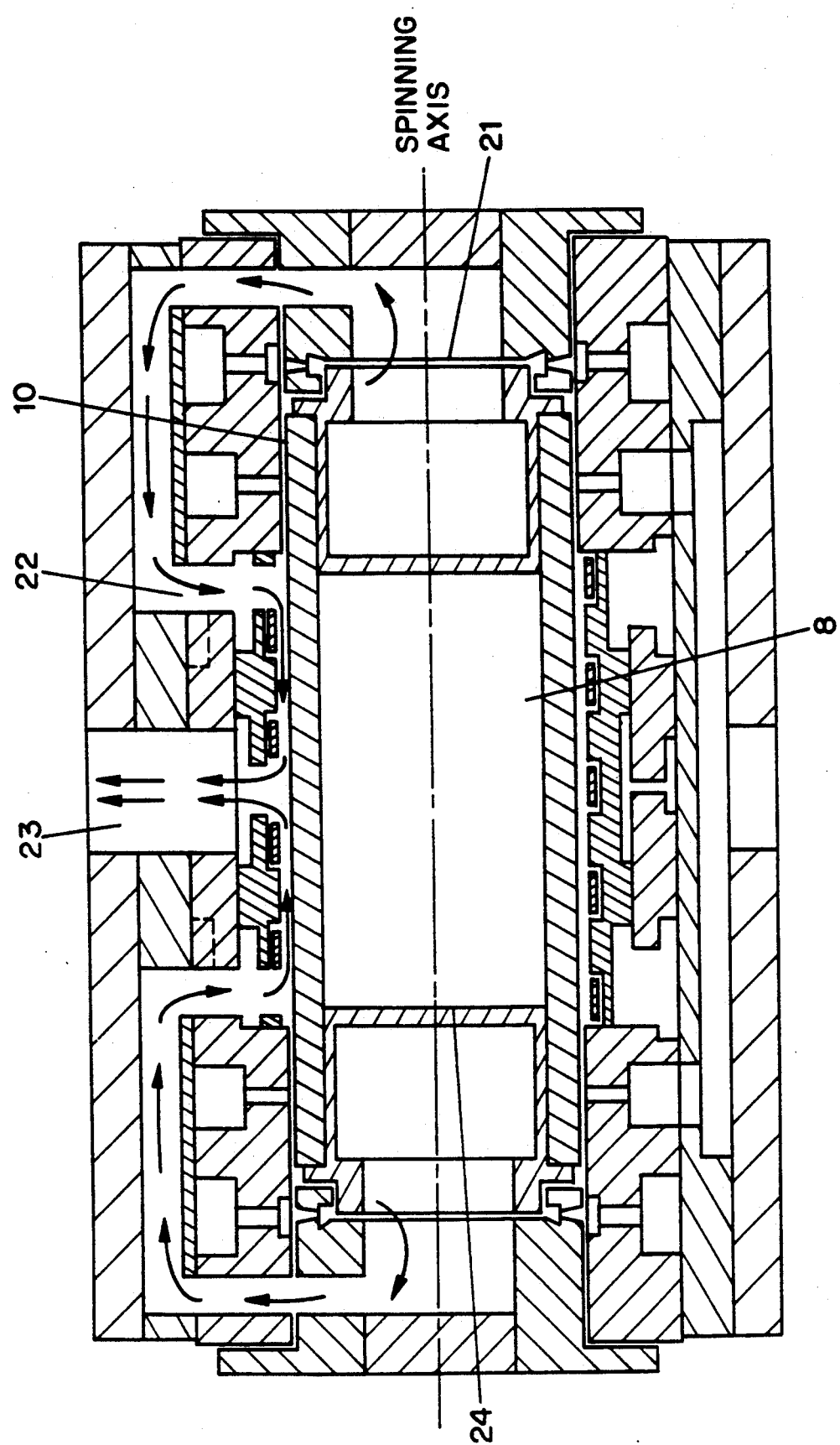
FIG. 2 illustrates the use of exhaust gas recirculation.

FIG. 2 illustrates the novel method of negating the frictional heating. The cool exhaust gas 21 is recirculated through the housing and injected through ports 22 adjacent to the bearing regions 10. The cool exhaust gas mixes with the warm bearing gas and flows axially inward over the surface of the rotor. The gas exits near the center of the housing through exhaust port 23. It is further desirable to extend the turbine plugs 24 axially inward beyond the bearing region 10 so that the sample 8 is more nearly uniform in temperature and is located within a more nearly uniform RF field due to the finite size of the RF coil. This minimizes temperature-dependent line broadening and greatly improves spectral resolution. The restricted sample volume has the additional benefit of improving rf homogeneity over the sample, thereby facilitating spinning-sideband Hartmann-Hahn matching and multi-pulse line-narrowing techniques. The sensitivity enhancements from cross polarization at high spinning speeds and improved resolution exceed the decrease expected from the reduced sample volume.

This cooling technique does not work satisfactorily with turbines of low insentropic efficiency as the exhaust flow rate is then too large to be handled conveniently in the limited space available for mixing with the bearing gas and flowing between the surface of the rotor and the RF coil. The technique has been found to reduce sample heating from about 60° C. to less than 2° C. in 10-mm sample spinners with turbine insentropic efficiencies near 40% and rotor surface speeds of Mach 0.8. Radial in-flow designs have been found to be particularly convenient for high efficiency microturbines, but axial-flow, radial out-flow, and mixed-flow microturbines with efficiencies above 10% could also be used.

Although this invention has been described herein with reference to specific embodiments, it will be recognized that changes and modifications may be made without departing from the spirit of the present invention. all such modifications and changes are intended to be included within the scope of the following claims.

I claim:

1. An NMR sample spinner comprising:
   a sample container having a first end and a second end supported on a gas bearing inside a bearing stator;
   a radio frequency coil surrounding a central portion of said sample container;
   said bearing stator including a plurality of bearing orifices in communication with radial bearing regions near both ends of said sample container;
   a first microturbine co-axially attached to said sample container at the first end thereof to effect spinning of said sample container;
   a housing for distributing pressurized gas to said bearing orifices and said microturbine;
   means for causing the exhaust gas from said microturbine to circulate over the central surface of said sample container.

2. The NMR sample spinner of claim 1 further comprising hollow plugs extending axially inward into the end of said sample container beyond the location of said bearing region.

3. The NMR sample spinner of claim 1 in which said microturbine operates with insentopic efficiency greater than 10%.

4. The NMR sample spinner of claim 1 in which said microturbine is of the radial in-flow type.

5. The NMR sample spinner of claim 1 in which said sample container is cylindrical, said gas bearing is cylindrical, and said bearing stator is cylindrical.

6. The NMR sample spinner of claim 1 in which said microturbine is removably attached to said sample container.

7. The NMR sample spinner of claim 1 in which said sample container further comprises a second microturbine co-axially attached to said sample container at the second end thereof.

8. A method of operating a sample spinner having a sample container supported on a gas bearing and having a microturbine, the sample container containing a sample, said method comprising the steps of:
   providing gas to the gas bearing;
   providing gas to the microturbine and collecting the exhaust therefrom; and
   cooling the sample with the microturbine exhaust.

9. A method of operating a sample spinner having a sample container supported on a gas bearing and having microturbines at ends thereof, the sample container containing a sample, said method comprising the steps of:
   providing gas to the gas bearing;
   providing gas to the microturbines and collecting the exhaust therefrom; and
   cooling the sample with the microturbine exhaust.

10. A sample spinner comprising:
   a sample container having a first end and a second end supported on a gas bearing inside a bearing stator;
   said bearing stator including a plurality of bearing orifices in communication with radial bearing regions near both ends of said sample container;
   a first microturbine co-axially attached to said sample container at the first end thereof to effect spinning of said sample container;
   a housing for distributing pressurized gas to said bearing orifices and said microturbine;
   means for causing the exhaust gas from said microturbine to circulate over the central surface of said sample container.

11. The sample spinner of claim 10 further comprising hollow plugs extending axially inward into the end of said sample container beyond the location of said bearing region.

12. The sample spinner of claim 10 in which said microturbine operates with insentropic efficiency greater than 10%.

13. The sample spinner of claim 10 in which said microturbine is of the radial in-flow type.

14. The sample spinner of claim 10 in which said sample container is cylindrical, said gas bearing is cylindrical, and said bearing stator is cylindrical.

15. The sample spinner of claim 10 in which said microturbine is removably attached to said sample container.

16. The sample spinner of claim 10 in which said sample container further comprises a second microturbine coaxially attached to said sample container at the second end thereof.

* * * * *